United States Patent [19]

Onyskevych et al.

[11] Patent Number: 5,644,327
[45] Date of Patent: Jul. 1, 1997

[54] TESSELLATED ELECTROLUMINESCENT DISPLAY HAVING A MULTILAYER CERAMIC SUBSTRATE

[75] Inventors: Lubomyr Stephen Onyskevych, Lawrenceville; Satyam C. Cherukuri, Middlesex; Ashok Narayan Prabhu, Mercer; P. Niel Yocom, Princeton, all of N.J.; Kenneth E. Salsman, Brush Prairie, Wash.

[73] Assignee: David Sarnoff Research Center, Inc., Princeton, N.J.

[21] Appl. No.: 472,540

[22] Filed: Jun. 7, 1995

[51] Int. Cl.$^6$ .................................................. G09G 3/30
[52] U.S. Cl. .................................................. 345/80; 313/503
[58] Field of Search .................................. 345/1, 76, 80, 345/903; 313/498, 503, 505; 315/169.3

[56] References Cited

U.S. PATENT DOCUMENTS

| | | |
|---|---|---|
| 3,828,215 | 8/1974 | Bilsback . |
| 3,855,499 | 12/1974 | Yamada et al. . |
| 4,266,223 | 5/1981 | Frame . |
| 4,368,467 | 1/1983 | Unotoro et al. . |
| 4,471,263 | 9/1984 | Harvey . |
| 4,508,990 | 4/1985 | Essinger . |
| 4,528,480 | 7/1985 | Unagami et al. . |
| 4,554,485 | 11/1985 | Yamada . |
| 4,603,280 | 7/1986 | Pankove . |
| 4,613,793 | 9/1986 | Panicker et al. . |
| 4,713,579 | 12/1987 | Miura . |
| 4,792,500 | 12/1988 | Kojima . |
| 4,843,280 | 6/1989 | Lumbard et al. . |
| 4,908,539 | 3/1990 | Meyer . |
| 5,099,301 | 3/1992 | Kikinis . |
| 5,153,483 | 10/1992 | Kishino et al. . |
| 5,156,924 | 10/1992 | Taniguchi et al. . |
| 5,179,316 | 1/1993 | Kellam . |
| 5,206,749 | 4/1993 | Zavracky et al. . |
| 5,256,469 | 10/1993 | Cherukuri et al. . |
| 5,277,724 | 1/1994 | Prabhu . |
| 5,283,500 | 2/1994 | Kochanski . |
| 5,302,966 | 4/1994 | Stewart . |
| 5,317,236 | 5/1994 | Zavracky et al. . |
| 5,336,879 | 8/1994 | Sauer . |
| 5,347,201 | 9/1994 | Liang et al. . |
| 5,347,292 | 9/1994 | Ge et al. . |
| 5,378,963 | 1/1995 | Ikeda . |
| 5,384,517 | 1/1995 | Uno . |
| 5,402,041 | 3/1995 | Kishino et al. . |

*Primary Examiner*—Jeffery Brier
*Attorney, Agent, or Firm*—William J. Burke

[57] ABSTRACT

An electroluminescent display formed on a ceramic substrate having a front ceramic surface and a back ceramic surface. The ceramic substrate includes a metal core that provides structural support, electrical ground, and heat dissipation. Electroluminescent cells are mounted on the front ceramic surface and driver circuits for driving the of electroluminescent cells are mounted on the back ceramic surface. The driver circuits are positioned directly behind said electroluminescent cells. Connectors extend through said ceramic substrate and the electroluminescent cells to different driver circuits. By positioning the driver circuits close to the EL cells, the drive lines from the drivers to the EL cells are short which allows for high refresh rates and low resistance losses. Each of the driver circuits can drive one electroluminescent cell or a group of electroluminescent cells. EL display cells coupled to a cermet electrode can also be driven by a field emission device or a low power electron beam.

15 Claims, 10 Drawing Sheets

TESSELLATED ELECTROLUMINESCENT DISPLAY HAVING A MULTILAYER CERAMIC SUBSTRATE

FIELD OF THE INVENTION

The present invention relates generally to electroluminescent displays, and in particular to an electroluminescent display formed on a multilayer ceramic substrate.

BACKGROUND OF THE INVENTION

Electroluminescent (EL) display technology, particularly full-color displays, have very serious limitations in their brightness, which depends upon the rate at which the capacitance of the EL cell is driven. The drive rate is limited by 1/(sq.root (RC)), where RC is the time-constant of the drive lines.

In a conventional display, the IC drivers are mounted at the edge of the display panel and drive all of the pixels in a selected row of the panel. As shown in FIG. 1, a plurality of IC drivers 36a–36h are located on the periphery of the display area. Scanner 37 controls the drivers 36a–36h. Select lines 26, driven by drivers 36a–36h, and data lines 30, driven by register 12, provide access to each pixel cell 32. A pixel cell 32 is located at the intersection of each select line 26 and data line 30. To address the display, a row of display data is supplied from shift register 12 while one of the drivers 36a–36h activates a select line 26. The display data activates pixels in the selected row. In this way, the entire display is addressed row by row.

The electrodes of each pixel cell 32 are connected in series, so that the electrode resistance of all the cells in a given row or column are connected in series. This creates a large RC time constant which limits the maximum possible drive rate and hence the brightness of the display. This is particularly bad, when driving a line of indium-tin-oxide thin-film (a transparent electrode). Typically, this film has a sheet resistivity of approximately 5Ω/square. A 10 mil wide 10 inch long line would thus have a resistance of approximately 5000 ohms.

Moreover, energy is required to charge the row and column electrodes to the voltage level needed for operation. This energy is normally lost when a new signal level is applied. Although energy recovery methods are available, these require added components and are sufficiently expensive that they tend not to be employed. The power used to charge the column electrodes is often an order of magnitude greater than that used to excite phosphor emission, and dominates the power dissipation of EL displays. Other parameters being equal, this power is directly proportional to the length of the column electrodes, and can be reduced if the column can be divided into many short electrodes.

One way to increase the drive rate, and hence the brightness of the display, is known as "active driving." Such a scheme, however, is extremely expensive, because it requires two transistors per pixel. As shown in FIG. 2, each EL cell 26 is driven by two transistors, 14 and 20. Data line 18 and select line 16 are used to activate the EL cell 26. A current source 28 provides current that flows through EL cell 26 and transistor 20 to ground. A capacitance is provided at each cell for signal storage. This type of display has the advantage of allowing all rows of a display to be driven simultaneously instead of one row at a time in displays with no storage capacity. However, they are much more complicated and difficult to fabricate than ordinary EL displays, and are prohibitively costly in large sizes. This configuration also requires the use of a large portion of the display area for mounting the driving transistors.

A somewhat less ambitious scheme is to drive small groups of pixels with a single driver. This, however, requires the ability to make contact with the electrodes not just at the edges of the display, but also at multiple points in the middle of it. Conventional EL panels (on a glass substrate) do not have this capability. An even more efficient scheme, is to drive larger groups of cells (or even complete rows or columns) from a single driver, but in parallel, rather than series.

SUMMARY OF THE INVENTION

The present invention is an electroluminescent display which includes a ceramic substrate. The EL cells are mounted on the front side on the ceramic substrate and the driver circuits are mounted on the back side of the ceramic substrate. The ceramic surface is polished and planarized to provide a smooth surface to support the thin films of the EL cells. Connectors extend through the ceramic substrate and couple the EL cells to the plurality of driver circuits. This allows the full area of the front surface of the ceramic substrate to be used for mounting EL cells. The driver circuits can be positioned anywhere on the back surface of the ceramic substrate. This shortens the length of the drive lines which reduces the RC time constant associated with driving each EL cell. The shortened length of the drive lines reduces the capacitance that must be charged and discharged by each different signal, and correspondingly reduces the power dissipated in this charging and discharging process. The reduced RC time constant increases the drive rate, and thus the brightness of the display.

Furthermore, the EL display mounted on the ceramic substrate can be combined with other ceramic substrates by abutting several ceramic substrates along their edges. This forms an enlarged display area.

In a second embodiment of the present invention, an EL display is driven by a field emissive device. This display has a thin film EL device including a cermet back electrode and a thin film phosphor layer coupled to the cermet back electrode. Control circuitry controls a field emission device which selectively emits electrons. The electrons which are emitted from the field emission device, cross a vacuum space, and contact the cermet back electrode. The electrons contacting the cermet back electrode cause portions of the EL display to emit light.

DETAILED DESCRIPTION OF THE INVENTION

The problems associated with the prior art EL displays are avoided by using a novel electronic packaging technology. A "Low-Temperature Co-fired Ceramic on Metal" (LTCC-M) technology is used to create the ceramic substrate. The ceramic substrate includes a metal core and a multilayer ceramic formed on both sides of the metal core. The ceramic substrate provides the ability to route connections, through the substrate, from EL cells mounted on the front side of the ceramic substrate to driver circuits mounted on the back side of the substrate.

Figure 1:
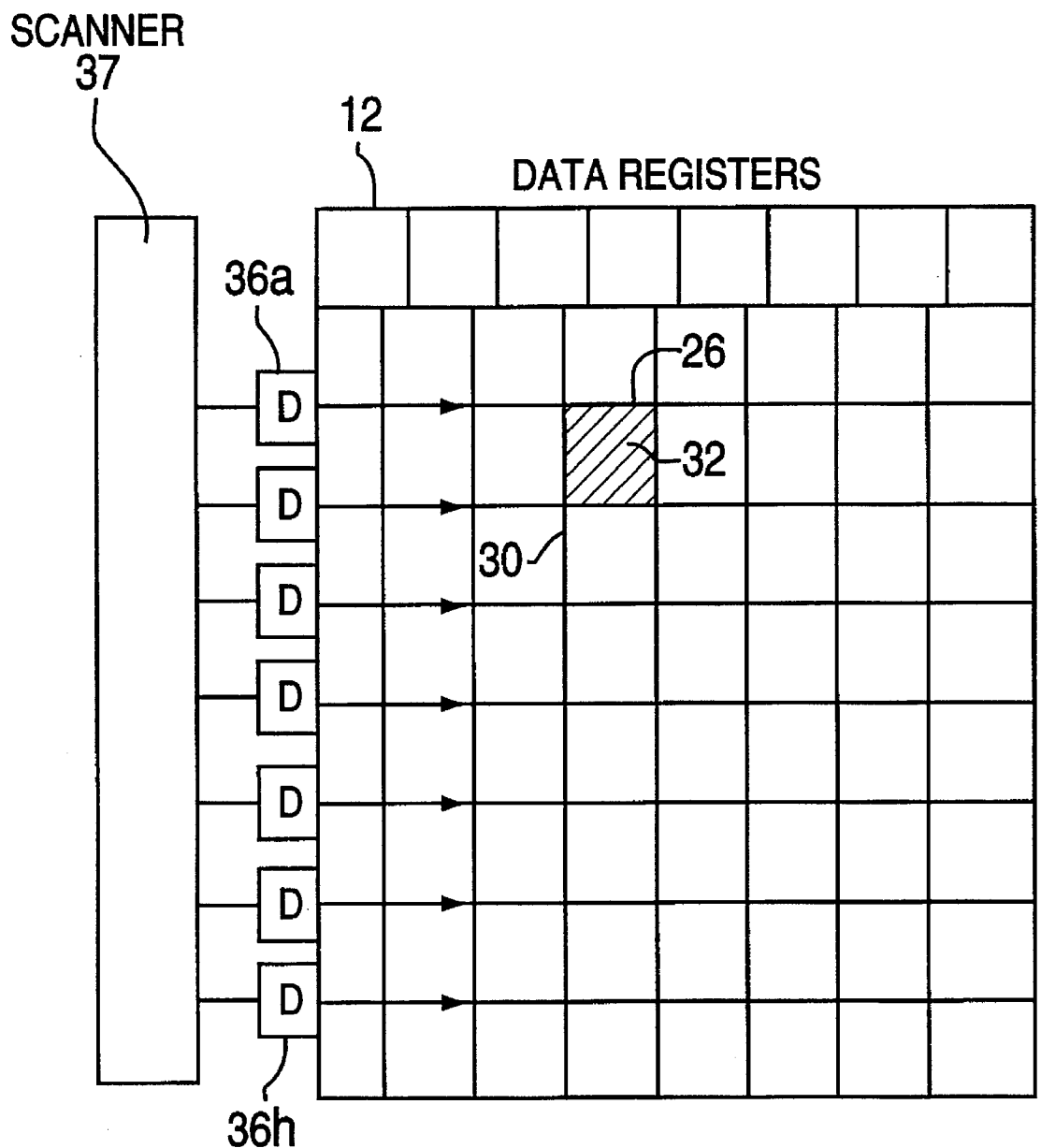
FIG. 1 (Prior art) is a block diagram of a conventional EL display.
Figure 2:
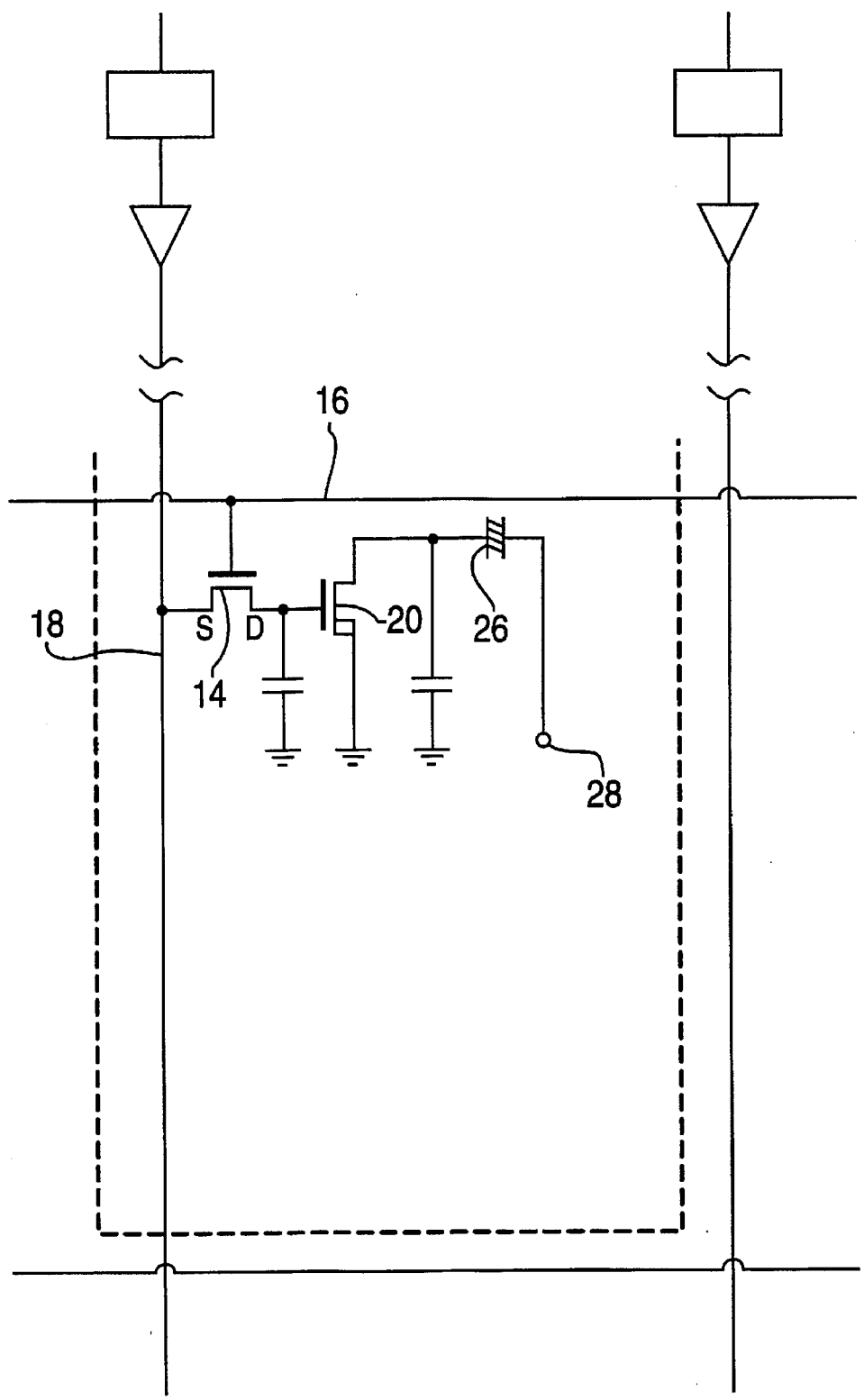
FIG. 2 (Prior art) is a schematic diagram of a conventional EL display using active driving of each EL cell.
Figure 3:
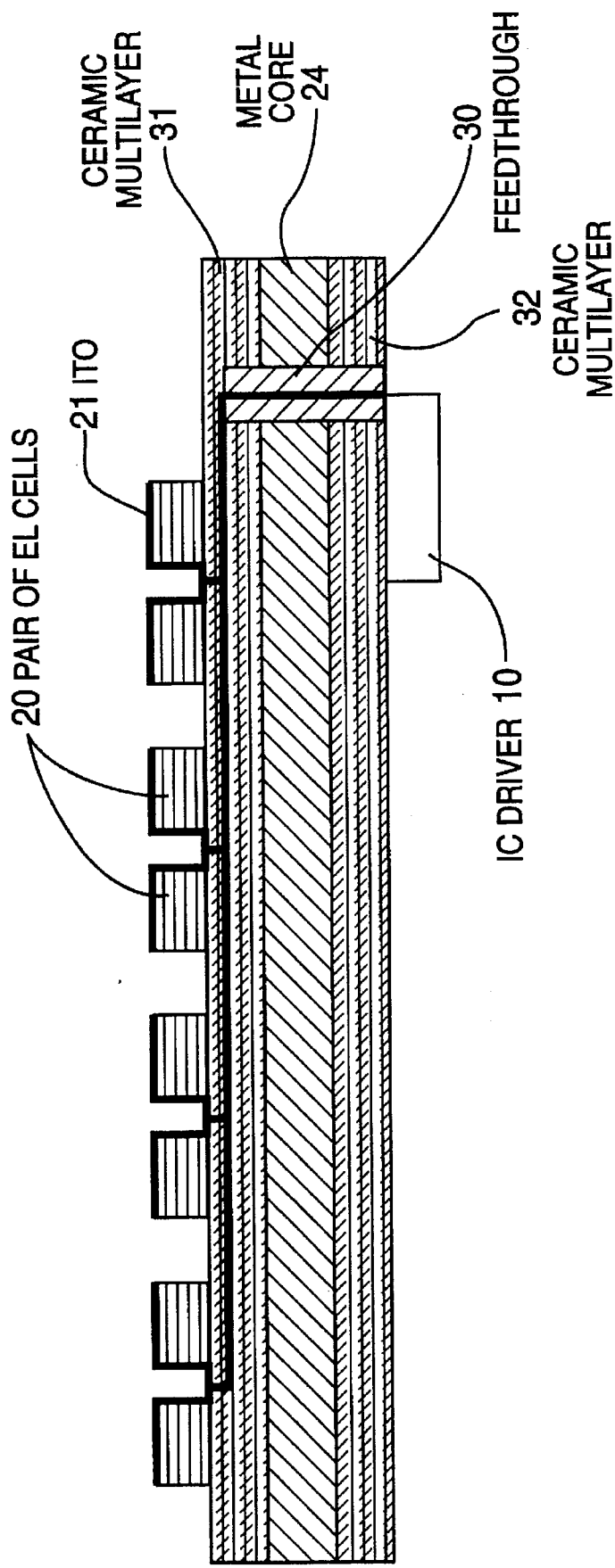
FIG. 3 is a side plan view of a structure which includes an EL display mounted on a ceramic substrate according to the present invention.

In order to route connections through the ceramic substrate, feedthroughs through the metal core are used. As shown in FIG. 3, feedthrough 30 allows the IC driver chip 10 mounted on lower ceramic layer 32 to be connected to pairs of EL display cells 20 mounted on the upper ceramic layer 31. An indium-tin-oxide layer 21 provides a transparent upper electrode for the EL cells 20. The ceramic multilayers 31 and 32, are built from low temperature cofire ceramic multilayer structures, preferably having thermal expansion characteristics that are matched to silicon.

Figure 5:
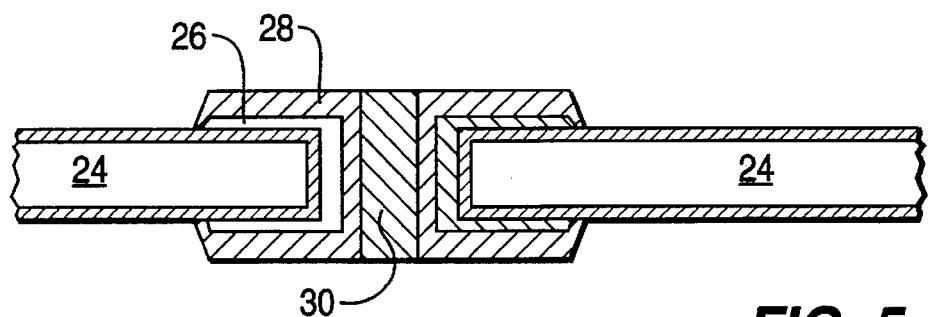
FIG. 5 is a side plan view of a portion of a structure such as that shown in FIG. 3, which illustrates a feedthrough formed in the metal core of the ceramic substrate.

FIG. 5 is a cross sectional view of a feedthrough 30. The upper ceramic layer 31 and the lower ceramic layer 32, shown in FIG. 3, are not shown in FIG. 5. The metal core 24 is preferably a Cu/Mo/Cu metal composite because this material provides good bonding to ceramic layers and because it is available in a wide range of thermal expansion coefficients which can be chosen to match the ceramic, although other material can be substituted. Openings are formed in the metal core 24 using a laser or mechanical drilling equipment that can drill small diameter holes. The holes in the metal core 24 are deburred and nickel plated which is accomplished through conventional nickel electroplating. In the example shown in FIG. 5, two dielectric glass layers 26 and 28 are formed on the metal core 24. However, a greater or lesser number of dielectric glass layers could be formed. The dielectric glass layers are formed by placing molten glass on one side of the metal core and applying a vacuum to the opposite side. This draws the glass through the hole to form a dielectric layer 26. The process is repeated to form dielectric layer 28. A thick film conductive fill ink is used to form the conductive fill layer 30. The conductive fill ink is made by mixing finely divided conductive metal powder with a preselected glass powder and organic vehicle. The conductive fill ink is applied to the metal core to fill the glass insulated hole and then fired to remove organic materials and to sinter the glass and metal powder to obtain a conductive, insulated feedthrough 30.

The metal core 24 supports the ceramic multilayers 31 and 32 which are formed on the metal core (as shown in FIG. 3). This entire structure is referred to as a ceramic substrate. The metal core 24 provides many important functions. It provides mechanical strength and structural support to the whole assembly. The ceramic multilayers 31 and 32 are rather brittle and could not reliably support large sized displays. The metal core 24 also provides electrical shielding and grounding and excellent thermal management, since it is a built-in heat sink, for efficient spreading of generated heat. The metal core 24 also constrains the shrinking of the ceramic multilayers 31 and 32 during firing. This maintains the mechanical stability of the ceramic multilayers throughout processing and allows high density circuits to be screened over large areas of the ceramic with good registration between layers. Additional information regarding the LTCC-M technology can be found in U.S. Pat. No. 5,277,724 entitled Method of Minimizing Lateral Shrinkage in a Co-Fired Ceramic-on-Metal Circuit Board and copending U.S. patent application entitled Electrical Feedthroughs for Ceramic Circuit Board Support Substrates, Ser. No. 08/379,264 filed Jan. 27, 1995, both of which are incorporated herein by reference.

Figure 4:
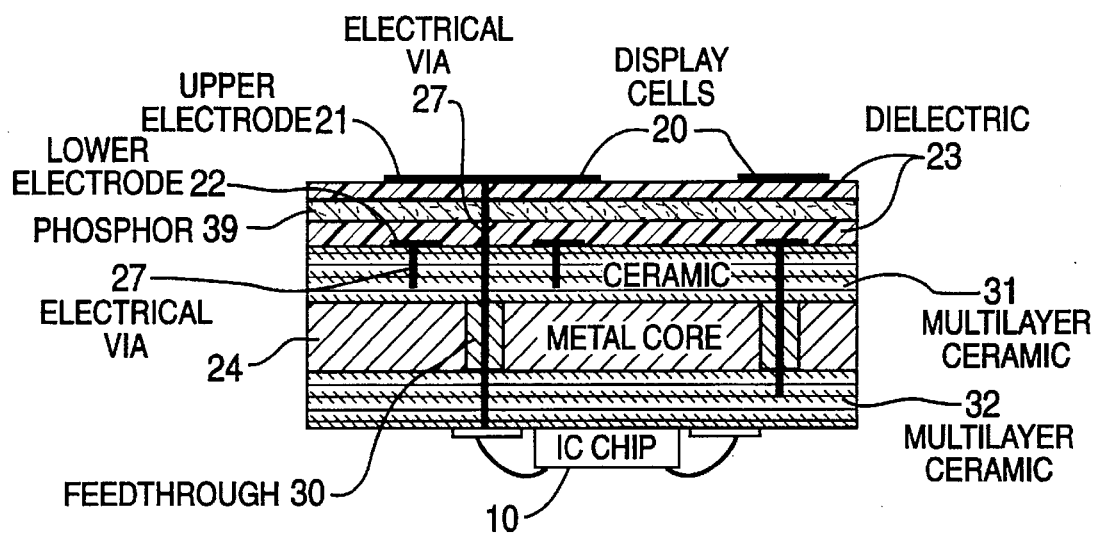
FIG. 4 is a side plan view of a structure such as that shown in FIG. 3, which illustrates the connections between EL cells and a driver circuit.
Figure 6:
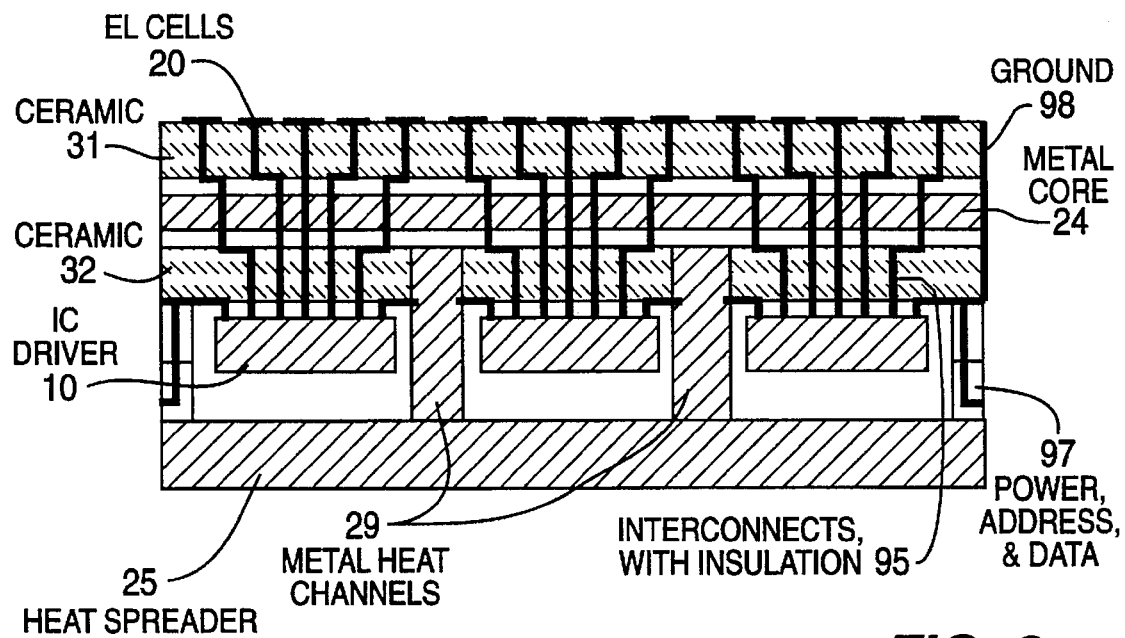
FIG. 6 is a side plan view of a structure such as that shown in FIG. 3, which illustrates a plurality of driver circuits connected to EL cells through the ceramic substrate.

As shown in FIG. 4, The LTCC-M technology enables placement of IC drive chip 10 on the back-side of the ceramic substrate. EL display cells 20 are placed on the front-side of the ceramic substrate. The IC drive chip 10 is connected to the EL cells 20 directly through the ceramic substrate. To achieve this integration of the EL cells 20 with the IC drive chip 10, power, address and data wirings 97 can be mounted on the side edge of the ceramic-metal-ceramic sandwich as shown in FIG. 6. Multilayer circuitry, embedded in the multilayer ceramic, can be used to further increase the circuit density and to decrease the path lengths (not shown in drawings). The ceramic layers 31 and 32 include imbedded circuit pathways (not shown in drawings) similar to those in conventional multilayer circuit boards.

FIG. 4 illustrates the EL display region in detail. The phosphor layer 39 is sandwiched between two dielectric layers 23. A transparent upper electrode 21, made of, for example, indium-tin-oxide, and a lower electrode 22 provide the necessary contacts to each EL cell. Electrical vias 27 electrically connect the upper electrode 21 to IC driver 10 and lower electrode 22 to circuit pathways in the multilayer ceramic 31 and multilayer ceramic 32. Thermal vias 41, shown in FIG. 7, transfer heat away from the EL display cells 20 and towards the metal core 24 which provides a heat sink.

Figure 9A:
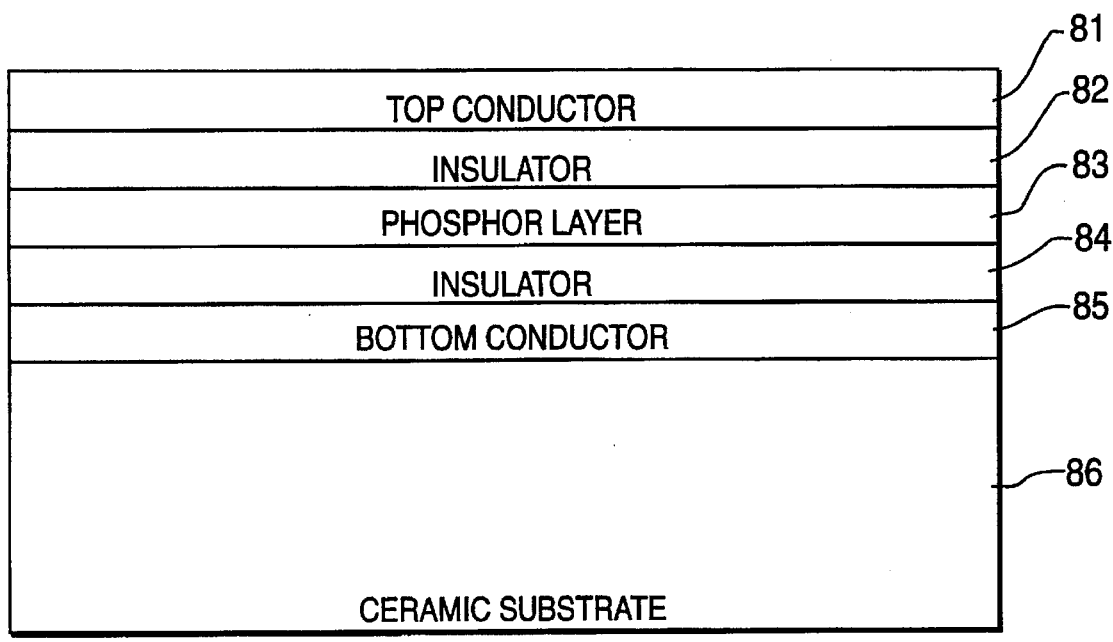
FIGS. 9A and 9B (Prior art) are side views of a conventional EL display formed on an ceramic substrate.
Figure 9B:
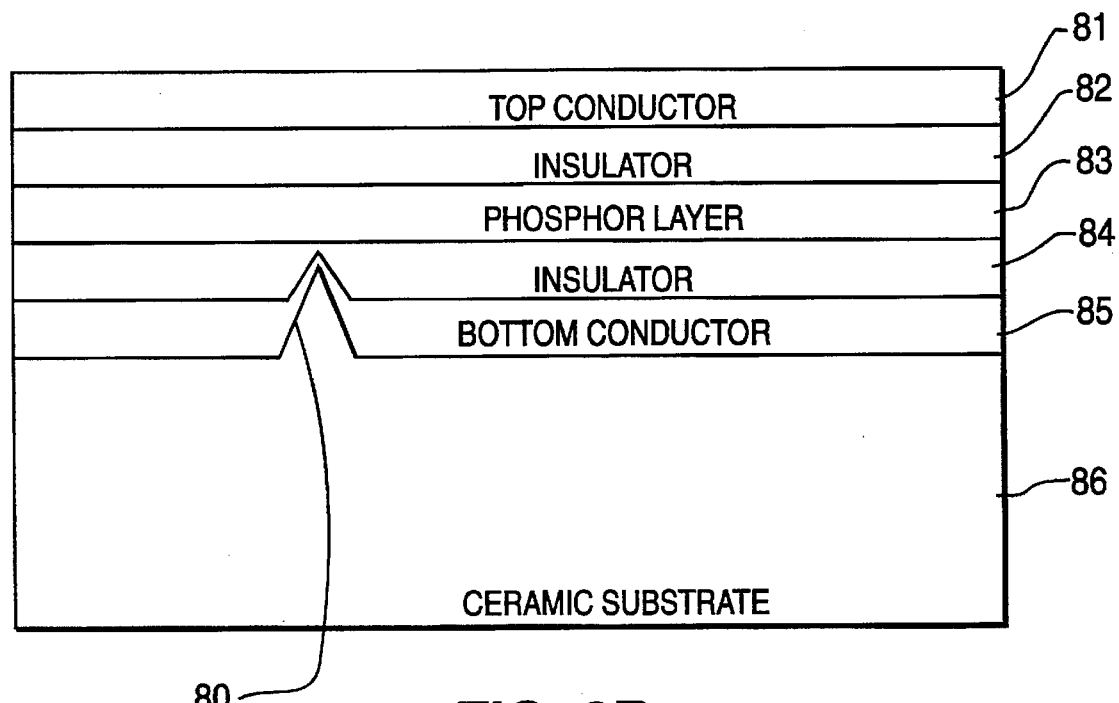

FIGS. 9A through 9D illustrate how the EL display is formed on the ceramic substrate. The EL cells are formed on the front surface of the ceramic substrate and include several layers. FIG. 9A shows a conventional EL display formed on a ceramic substrate 86. It comprises a printed bottom conductor 85, an insulator 84, a phosphor layer 83, an optional second insulator 82 and a top conductor 81. Each layer 81–85 is on the order of 1 micrometer thick.

One difficulty in forming an EL display on a ceramic substrate has been the tendency of roughness in the substrate surface to cause faults in the thin insulator layers of the EL stack. For example, an asperity 80 is shown penetrating the bottom insulator layer in FIG. 9B. There is little insulation between the bottom conductor 85 and the phosphor layer 83 near asperity 80. Asperities of a micrometer high are sufficient to penetrate the insulator layer 85, causing electrical breakdown during operation and rendering the display useless. Ceramic surfaces typically have a roughness of this magnitude or more, and so have been unsuitable in the past for supporting the TFEL stack.

Figure 9C:
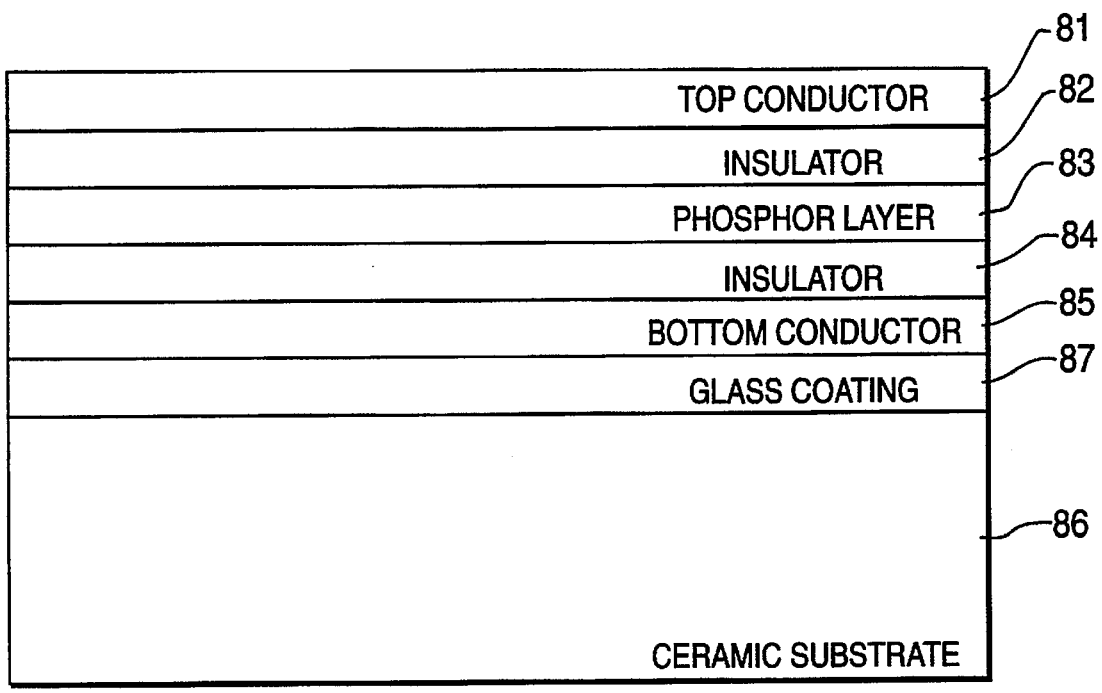
FIGS. 9C and 9D are side views of a structure such as that shown in FIG. 3, which illustrates the layers forming the EL cells on the ceramic substrate.

The present invention provides two solutions to the problems in the prior art. As a step in the fabrication of the EL display on LTCC-M substrates, the surface of the top ceramic layer 86 is polished to a fine finish and, if necessary, coated with a planarizing layer of glass. The polish alone may be sufficient to fix the roughness problem. If not, a layer of glass (for example boro-phospho-silicate glass, BPSG) can be applied by spinning or by chemical vapor depositing (CVD). The techniques for applying these layers are well known in the semiconductor industry for coating silicon devices, but are not commonly used for coating ceramics. Such glass layers are smooth on the micrometer scale. The resulting structure is shown in FIG. 9C, with a polished ceramic layer 86 and a layer of CVD glass 87. Without the polishing or the glass coating, EL displays tend to burn out quickly. However, with a polish and a layer of CVD BPSG over the substrate as shown in FIG. 9C, the displays will operate for relatively long periods without failure.

Figure 9D:
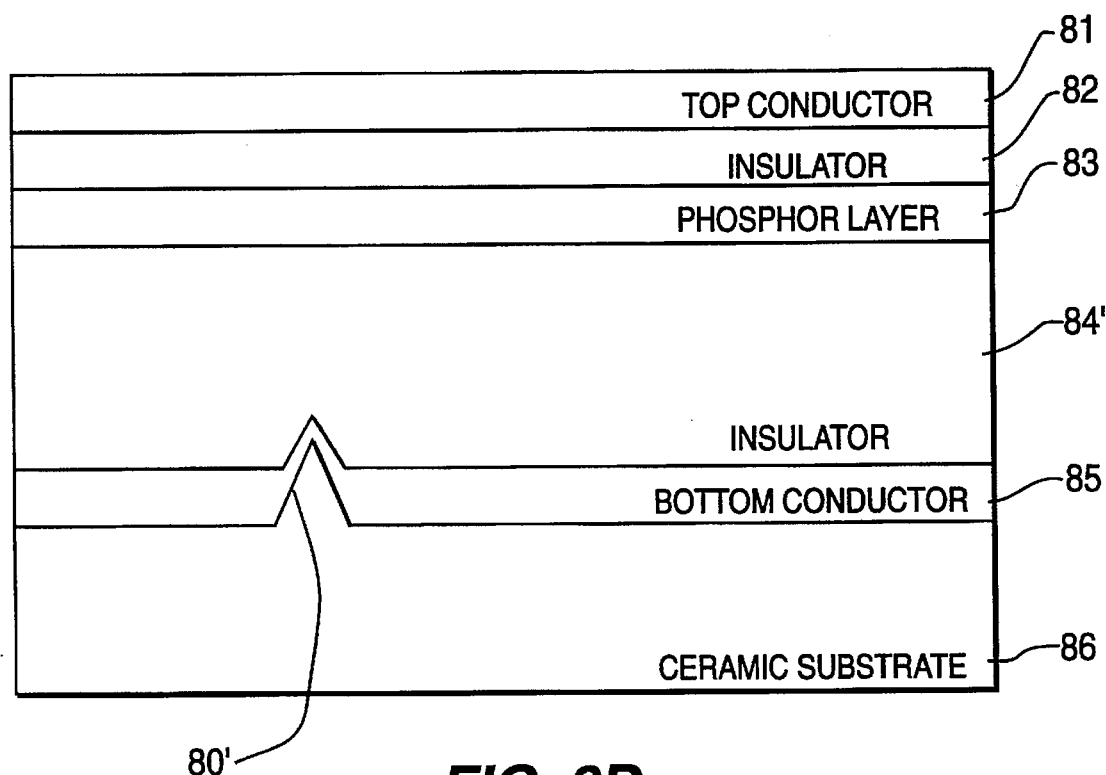

An alternative approach to that shown in FIG. 9C is shown in FIG. 9D. The insulating layer 84 is replaced with a thick insulator 84'. If this layer is many micrometers thick, then small asperities such as 80' do not penetrate it. In the operation of EL displays, a voltage is applied between the top and bottom conductors. Light emission is related to the voltage across the phosphor. However, some of this voltage is dropped across the insulator, reducing the voltage available across the phosphor. The magnitude of the voltage dropped across the insulator rises as the insulator thickness increases. To minimize the voltage drop across the insulator 84', it should be fabricated of a material which has a high dielectric constant.

For EL devices fabricated on LTCC-M substrates, the insulator film can be formed of a green tape which, when fired, forms a ceramic with a high dielectric constant. Such a ceramic can be made by including a significant fraction of barium titanate or similar material with a high dielectric constant. A very high dielectric constant is not necessary. Increasing the thickness of the insulator 84 to about 25 micrometers instead of 1 micrometer only requires an increase in the dielectric constant of about 25 times to about 300. This is sufficient to recover the same voltage drop as is provided by typical present insulators.

The driver circuitry 10 on the back of the ceramic substrate activates the EL display cells 20 formed on the front side of the ceramic substrate (see FIG. 4). The drivers provide a voltage across the phosphor layer which causes the phosphor to emit light. In one configuration, the upper electrode 21 is connected to ground. The individual EL cells are activated by providing a sufficient AC voltage to the lower electrode. The intensity of the cell light output can be modulated by controlling either the magnitude of the AC voltage or the AC drive frequency.

The present invention provides the ability to place the IC drive chips 10 as close as possible to the EL display cells 20, and thus to minimize the lengths of the drive-lines. This immediately reduces the relatively high resistance of the drive line (typically, from about 5000 ohms to about 5 ohms), and, to a lesser extent, also the capacitance of the line, and thus the RC time constant. A conservative estimate shows an increase in the drive frequency from typically 60 Hz to at least 400 to 500 Hz, thus increasing the brightness by a factor of approximately 10 relative to the conventional EL display. The power-efficiency of the system also increases with this change. The conductive material in the feedthroughs 30 has a lower resistance than the long drives lines used in prior art displays. This decrease in resistance also decreases the associated IR losses and thus, reduces the amount of heat generated by the display. Additional power efficiency accrues from the reduction of the electrode capacitance because each time an electrode voltage is changed, the charge and the energy stored in the related capacitance is lost.

There are many ways to connect the IC drivers to the EL cells in the display. One IC driver can be connected to the upper electrode and one to the lower electrode, for each cell (as in active addressing) for maximum drive speed. However, this configuration has the highest requirements for drivers and interconnections. At the other extreme, each IC driver can drive only a single row or column (as in the "conventional" addressing). The configuration of drivers to EL cells dictates the addressing used. For example, if one driver is provided for one row of EL cells, then conventional row by row addressing is suitable. However, if one driver is provided for a N×N group of EL cells, then group based addressing (described below with respect to FIG. 13) may be desirable.

Figure 13:
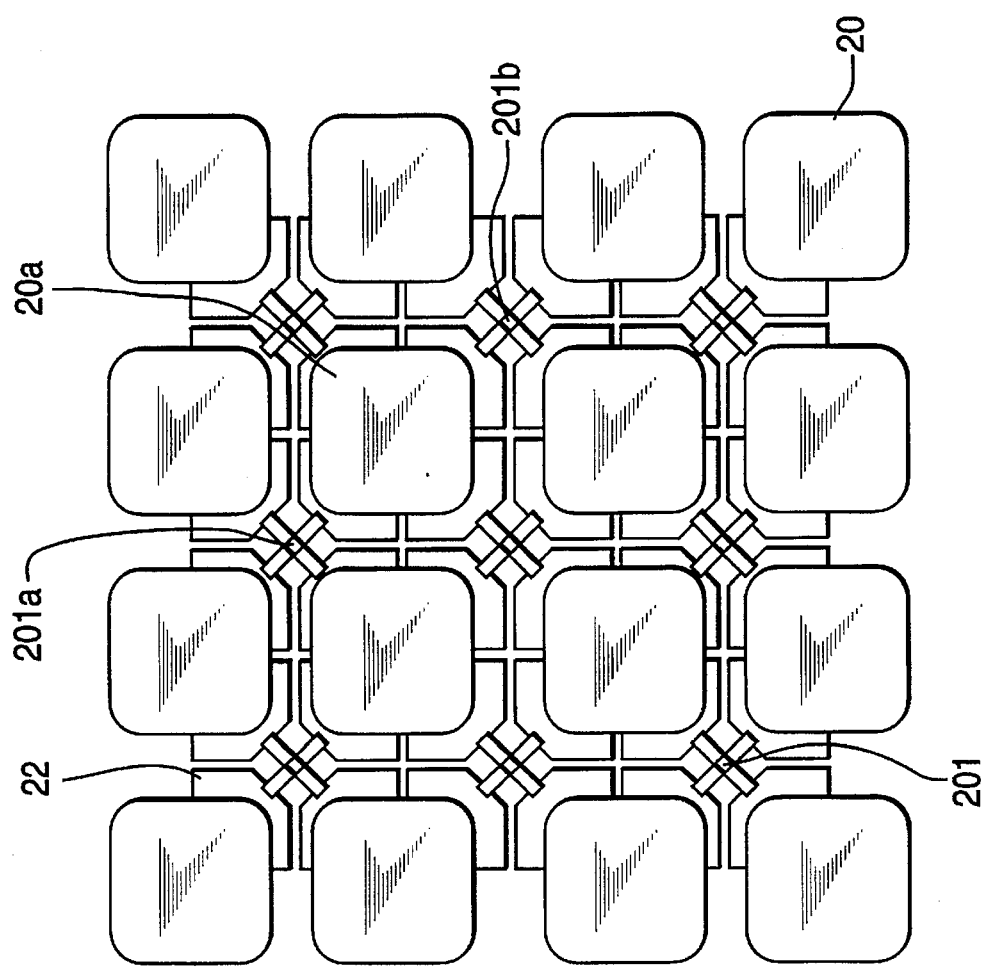
FIG. 13 is a top plan view of a portion of the EL cells shown in FIG. 3.

FIG. 13 illustrates how each driver may be coupled to a group of EL cells. Patterned lower electrode 22 is connected to a plurality of EL cells 20. The patterned lower electrode includes four pads connected together at a lower central terminal 201. Each lower central terminal 201 is connected to a driver (not shown). Address lines (not shown) are used to activate drivers coupled to the lower electrode 22 at each lower central terminal 201. A similarly patterned upper electrode, is positioned above the EL cells 20 and contacts the EL cells in the same fashion (not shown). The upper electrode central terminals may be connected to ground through gates (not shown). Address lines activate the gates coupled to the upper central terminals of the upper electrode to connect the upper central terminals to ground (not shown).

An EL cell is activated by providing power to a lower central terminal in the lower electrode and grounding an upper central terminal in the upper electrode. The upper central terminal is offset from the lower central terminal by one row and one column. For example, to illuminate EL cell 20a, a signal is provided along the address lines to the driver coupled to lower central terminal 201a. The driver provides a source voltage to the four EL cells connected to lower central terminal 201a. Address lines associated with the upper electrode activate a gate coupled to the upper central terminal at location 201b. The upper central terminal 201b is offset from the lower central terminal 201a by one row and one column. The gate, once activated, grounds the upper central terminal at position 201b. By grounding upper central terminal 201b, the circuit across the EL cell 20a is completed and the EL cell 20a emits light. FIG. 13 illustrates 4 EL cells coupled to each driver through a central terminal. Similarly, groups of 9, 16, 25, etc. can be coupled to each driver. A compromise must be reached between cost and speed. The fewer pixels per cell, the faster, but the more expensive the arrangement.

Electrical vias through the ceramic substrate provide direct connections from signal processing circuitry to small groups of pixels as shown in FIG. 13, or even to individual pixels as shown in FIG. 6 for completely active drive of the display. As shown in FIG. 6, each IC driver 10 is connected to an individual EL cell 20 through interconnects 95. Metal heat channels 29 and heat spreader 25 provide a heat sink which is necessary as the number of IC drivers increases. A ground connection 98 is connected to the top electrode to form a continuous ground plane. A plurality of tapered interconnects 95 are provided through stacked, cofired ceramic layers, by electrical vias, to connect the display elements to the driver devices. The IC drivers 10 are attached and electrically connected to the substrate electrodes by a standard flip-chip bonding process. Power, data, and address wirings 97 are provided on the edges of the ceramic substrate. Heat-spreader 25, made from copper or aluminum (for light weight) is attached to the backside of the ceramic and the devices through a thermal adhesive. The backside heat spreader 25 can be either continuous (if the mounted devices are level with the ceramic) or cut with windows to accommodate IC drivers 10.

Both the EL display cells on the front of the ceramic substrate and the IC drivers on the backside of the ceramic substrate should be encapsulated, or otherwise protected from the environment. The EL display can be overglazed by a low-melting-temperature glass. Depending upon the application, the Chip-on-Board (COB) electronic circuitry on the backside can either be "glob-topped" (for very inexpensive devices), conformally coated, or enclosed in a hermetic enclosure. Hermetic enclosures are particularly easy and inexpensive to achieve with the LTCC-M technology, because the interconnections can be made through a lower conductor layer, thus eliminating the need for any lines to be fed through the hermetic seal.

Figure 7:
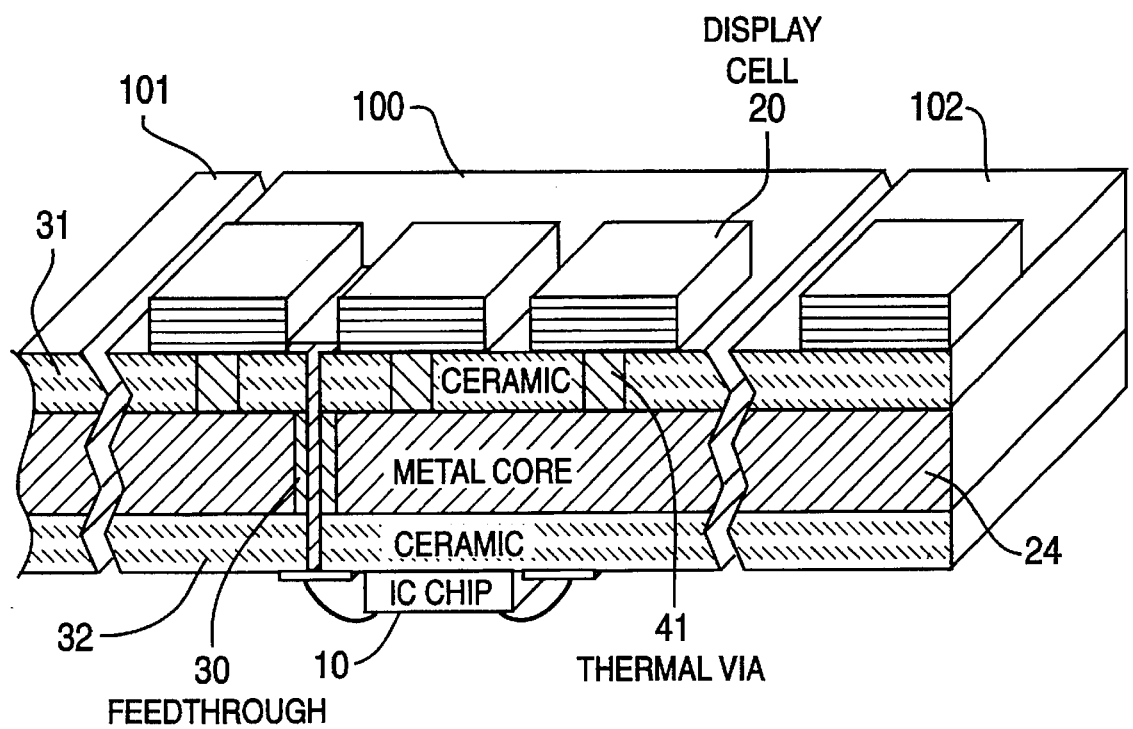
FIG. 7 is a perspective view of multilayer structures such as that shown in FIG. 3, which illustrates tiling ceramic substrates to form a large area display.

Because of the great dimension stability and machineability of the LTCC-M substrates, it is possible to create very large (wall-sized) display panels, by tiling individual display devices. Individual display devices can be made up to at least 20" diagonal size. However as the size of the individual display devices increases, the processing equipment becomes more expensive, and for very large sizes it is more convenient to tile smaller individual display devices. FIG. 7 illustrates how the individual display devices are positioned to form a larger area display. In FIG. 7, a first individual display device 100 includes an IC drive chip 10 and a plurality of EL display cells 20. Only a portion of the individual display device 100 is shown for convenience. Individual display devices 101 and 102 are abutted to tile 100 to form an enlarged display.

Figure 8:
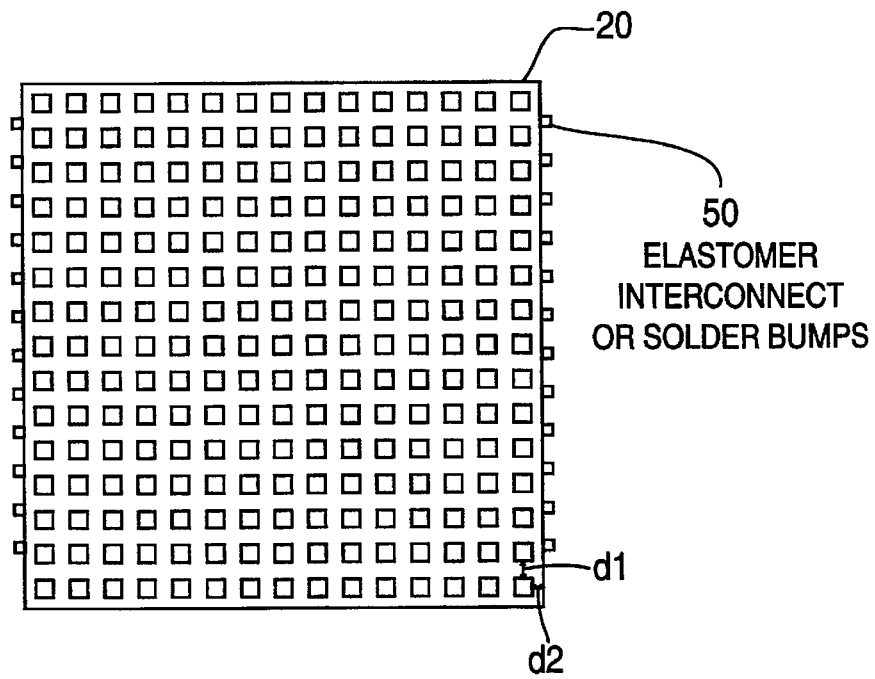
FIG. 8 is a top plan view of a structure such as that shown in FIG. 3, which illustrates the placement of EL cells on the ceramic substrate and edge connectors for abutting ceramic substrates.

FIG. 8 illustrates a single tile display including EL display cells 20 and connectors 50. The connectors 50 can be solder bumps or can be fabricated from a conductive elastomer. In order to avoid tiling artifacts, the distance d2, from the edge of an EL display cell to the edge of the tile should be equal to or less than one half distance d1, the spacing between each EL display cell. This ensures that when individual display devices are abutted, a smooth transition in the display occurs from one individual display device to the next.

Tiling of individual display devices is particularly easy to achieve with the LTCC-M technology, because the ceramic substrates are extremely stable dimensionally, the ceramic substrates can be polished to perfect flatness to achieve mechanically seamless construction, and the El display cells can be placed to the very edge of the tile.

If several individual display devices are abutted to form a large display, some control circuitry is necessary. Conventional light-sensors and dynamic brightness-equalization circuitry (not shown in drawings) may be integrated with the complete structure. These devices ensure that the brightness over the large display is uniform and not effected by brightness variations between individual display devices. Also, by incorporating a programmable control into the on-board drive system, each individual display device can be adjusted to match its neighbors in brightness, and in colorimetry, thereby further eliminating tiling artifacts. Such a tiled display utilizes a parallel addressing scheme to each individual display device and each individual display device addresses the pixels as in a normal matrixed panel.

Current evaluations of this approach show that display panels can be fabricated with pixel densities of from 40 to 80 pixels per inch (this is equivalent or better than plasma displays). Displays utilizing multiple individual display devices could reach several feet on a side, eventually achieving film quality and theater size.

A second embodiment of the present invention is now described. The second embodiment includes EL cells mounted on one side of a substrate and a field emission device, located behind the substrate, for driving the EL display cells.

Of the flat panel display technologies that are under development, the Thin Film Electroluminescent (TFEL) and Field Emissive Device are both promising self luminant displays.

However, TFEL has brightness limitations that makes the blue phosphor (the least efficient) a hindrance in the production of color displays. The traditional solution to the brightness problem requires better materials and a new radical approach, using CMOS and DMOS transistor technologies to make a high voltage active matrix. However, this requires high yield processes and is risky.

FEDs have been demonstrated as a display technology, but have not yet been successful in producing a long life, bright, full color display. The electron emission structure requires patterned electron emission tips or the formation of rough topographic surfaces to form randomly distributed emission points. The energy level requirement for normal cathodoluminescent phosphors to emit light is high enough that the emission tips tend to have very short life times due to cold emission of electrons. Working FED panels have been demonstrated using a unique low energy phosphor, however, the practicality of this technology lies in the ability to utilize normal phosphors to produce full color images, without destroying the emission tips in the process.

The second embodiment of the present invention is a Thin Film Electroluminescent device that is stimulated to luminescence by the electron emission from a Field Emission device. This technology combination creates a display that can be refreshed at high rates, producing high levels of brightness from the EL phosphor, and requiring relatively low power emission from the field emitter, reducing the required emission from each tip to within the capability of existing materials. Such a display can be expected to provide full color at brightness levels comparable to CRTs. Because there are no electron optics, the pixel regions can overlap, providing depixelated images similar to CRTs. Resolution of such displays is controlled by the FED which is fabricated in an IC-like process at micron level design rules, providing the potential for extremely high resolution displays.

The concept of using an electron beam to increase the electrical field potential across a TFEL structure to stimulate photon emission is also applicable to CRTs. A low power electron beam could be used to increase the local field density in a TFEL film providing a lumination spot corresponding to the beam location and size. This approach has the potential for producing very high resolution CRTs due to the greatly reduced electron beam energy requirement. As the beam energy increases, the spread or spot size increases. Currently it takes very sophisticated electron optics to confine and control the spot size and shape to produce high-resolution, high-brightness CRTs. The ability to use low energy electron beams can provide a major improvement in the performance and manufacturability of high resolution CRTs.

Figure 10:
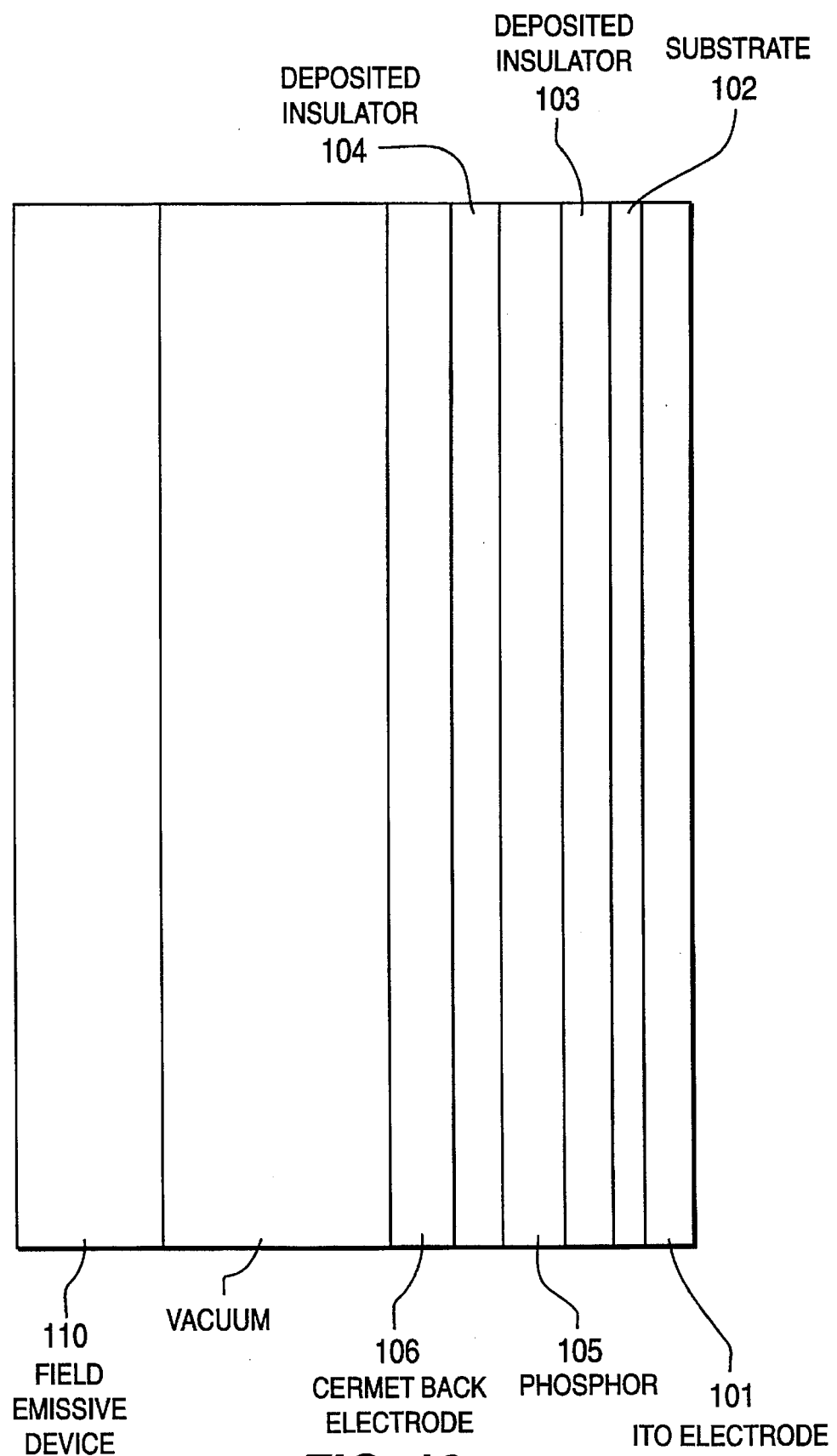
FIG. 10 is a side plan view of a field emission driven EL display according to the second embodiment of the present invention.

FIG. 10 illustrates the field emission—electroluminescent (FE-EL) display of the present invention. The FE-EL panel is composed of a non-patterned ITO electrode 101 on a substrate 102. Deposited insulators 103 and 104 are formed on both sides of a thin film phosphor layer 105 (typical of current TFEL displays). A cermet back electrode 106 composed of Aluminum Oxide or similar material is formed on the deposited insulator 104. The combination of the electrodes 101 and 106, deposited insulators 103 and 104 and phosphor layer 105 are referred to as the EL stack. A field emission device (FED) 110 is located behind the cermet back electrode 106. The space between FED 110 and the cermet back electrode 106 is evacuated to form a vacuum.

Figure 11:
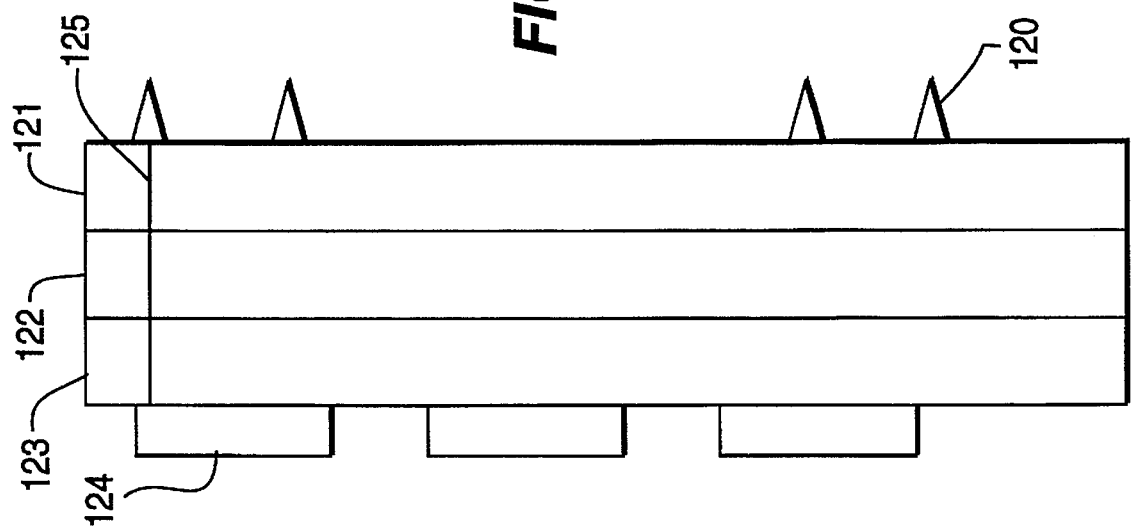
FIG. 11 is a side plan view of a portion of a structure such as that shown in FIG. 10 which illustrates the field emission device.

The FED may be mounted on a LTCC-M substrate as shown in FIG. 11. The field emissive device 110 includes a surface of patterned emission tips 120 or a topographically structured low work function material. This device also includes electronics 124 to address specific pixel regions and control the addressing and refresh rates. The emission tips 120 are formed on a front ceramic multilayer 121. Control electronics 124 are mounted on the back ceramic multilayer 123. The metal core 122 provides structural, electrical, and thermal functions as described above in the first embodiment. Electrical vias 125 through the ceramic substrate allow direct connection of the FED drivers to the FED emission tips. This allows for good hermetic enclosure of the entire FED device because no lines need to pass through the hermetic seal.

A potential is applied across this EL stack to bring it just below the luminance threshold (approximately 150 Volts). This potential is cycled to provide up to 10,000 Hz refresh on the EL stack. The cermet electrode 106 allows the local buildup of electrical charge over short periods in response to emission from the FED tips 120, while providing a continuous electrical contact over the display area. The TFEL phosphors 105 emit a light pulse each time the phosphor undergoes a positive voltage transient (i.e. each time a FED creates a local increase in electrical potential). The standard EL materials can handle refresh rates up to 10 KHz providing an increasing light output as the refresh rate increases. (Refresh rates over 10 KHz can saturate the phosphor, leading to breakdown and loss of light emission). At the 10 KHz rate, a brightness of up to 3000 ft-L has been observed.

By using the ITO electrode 101 in the EL stack as the anode, electrons travel from the emitters of the FED 110 to the cermet electrode 106 and provide a potential field across the EL stack (expected to be ≦50 Volts). The FED 110 generates an electron field density on the cermet electrode 106 that brings the selected region of the TFEL stack over the luminescent threshold and causes the EL phosphor 105 to emit light as long as the electron field is maintained. During this pixel "on" time the 10 KHz cycled potential across the EL stack acts as a refresh signal causing the phosphor 105 to undergo a series of voltage transients. Gray level control can then be established by controlling the number of refresh cycles, which in this case is controlled by the length of time that the FED provides the "on" voltage signal to a specific region. The 10 KHz refresh allows a large number of gray levels to be displayed.

Figure 12:
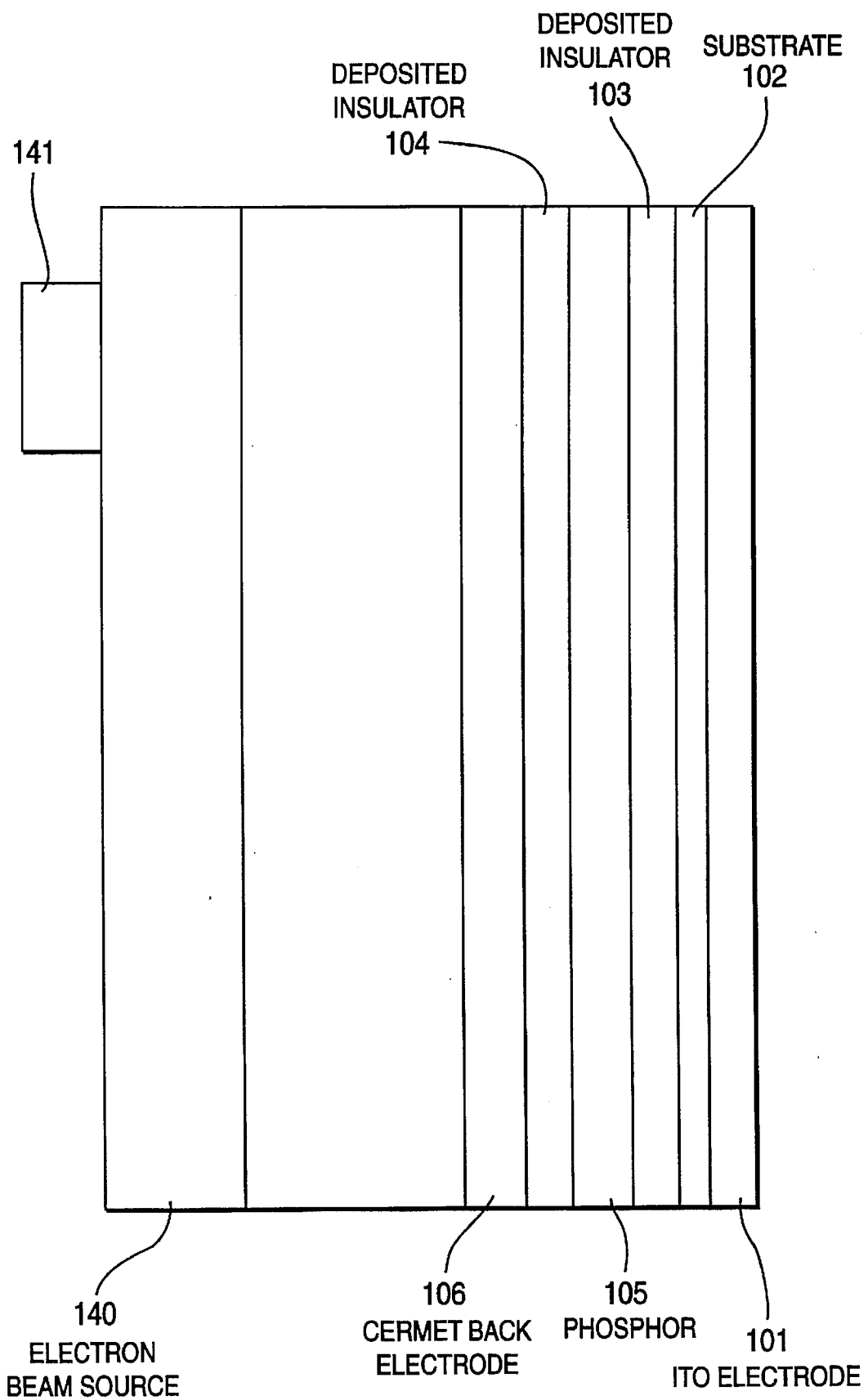
FIG. 12 is a side plan view of electron beam driven EL display according to the second embodiment of the invention.

FIG. 12 illustrates the use of a low power electron beam source 140 to activate the EL display. A conventional control device 141 is provided to control the position of the low power electron beam. The cermet back electrode 106 is charged to a potential just below the luminescent threshold of the phosphor layer. Electrons provided by the electron beam source 140 contact the cermet back electrode 106. This brings the selected region of the TFEL stack over the luminescent threshold and causes the phosphor 105 to emit light. This allows the use of a low power electron beam 140 which, due to its low energy, provides a relatively finer size, and thus, a high resolution display.

While the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. An electroluminescent display comprising:

a ceramic substrate having a first planar surface;

a plurality of electroluminescent cells mounted on said first planar surface;

a plurality of driver circuits for driving the plurality of electroluminescent cells; and a plurality of connectors extending through said ceramic substrate which couple the plurality of electroluminescent cells to the plurality of driver circuits, each of the plurality of connectors comprising an insulating wall defining an insulated via through said ceramic substrate, said via being filled with a conductive material.

2. The electroluminescent display of claim 1 wherein:

said ceramic substrate has a second planar surface parallel to the first surface, and the plurality of driver circuits are mounted on said second planar surface of said ceramic substrate.

3. The electroluminescent display of claim 1 wherein each of said plurality of driver circuits drives a respectively different one of said electroluminescent cells.

4. The electroluminescent display of claim 1 wherein each of said plurality of driver circuits drives a respectively different group of electroluminescent cells.

5. An electroluminescent display comprising:

a ceramic substrate having a first planar surface, wherein the ceramic substrate comprises a metal core layer positioned between two ceramic layers;

a plurality of electroluminescent cells mounted on said first planar surface;

a plurality of driver circuits for driving the plurality of electroluminescent cells; and a plurality of connectors extending through said ceramic substrate which couple the plurality of electroluminescent cells to the plurality of driver circuits.

6. The electroluminescent display of claim 2 wherein the plurality of electroluminescent cells and the plurality of driver circuits are encapsulated.

7. An electroluminescent display comprising:

a ceramic substrate having a first planar surface and a second planar surface parallel to the first surface, wherein the ceramic substrate includes an edge surface perpendicular to said first and second planar surfaces, said edge surface including connectors for electrically connecting the ceramic substrate with a second ceramic substrate;

a plurality of electroluminescent cells mounted on said first planar surface;

a plurality of driver circuits for driving the plurality of electroluminescent cells; and a plurality of connectors extending through said ceramic substrate which couple the plurality of electroluminescent cells to the plurality of driver circuits.

8. The electroluminescent display of claim 7 wherein the ceramic substrate is electrically connected to said second ceramic substrate by abutting the edge surface of said ceramic substrate against an edge surface of said second ceramic substrate, each of said edge surfaces including electrical connectors.

9. An electroluminescent display comprising:

a ceramic substrate having a first planar surface;

a plurality of electroluminescent cells mounted on said first planar surface;

a plurality of driver circuits for driving the plurality of electroluminescent cells; and a plurality of connectors extending through said ceramic substrate which couple the plurality of electroluminescent cells to the plurality of driver circuits, wherein ones of said plurality of electroluminescent cells are placed adjacent to the edge of said first planar surface and wherein the spacing between the edge of said first planar surface and said ones of said electroluminescent cells is less than one half of the spacing between adjacent electroluminescent cells placed at an interior portion of said first planar surface.

10. The electroluminescent display of claim 9 wherein the ceramic substrate includes:

a second planar surface parallel to the first planar surface and an edge surface perpendicular to said first and second planar surfaces and a large area display is formed by abutting the edge surfaces of a plurality of ceramic substrates.

11. The electroluminescent display of claim 5 wherein the metal core layer includes feedthroughs for providing signal distribution from said plurality of driver circuits to said plurality of electroluminescent cells.

12. The electroluminescent display of claim 5 wherein the metal core layer provides a means for heat dissipation.

13. An electroluminescent display comprising:

a ceramic substrate having a first planar surface, wherein the first planar surface of said ceramic substrate is polished and includes a glass layer deposited on the polished first planar surface of the ceramic substrate;

a plurality of electroluminescent cells mounted on said first planar surface;

a plurality of driver circuits for driving the plurality of electroluminescent cells; and a plurality of connectors extending through said ceramic substrate which couple the plurality of electroluminescent cells to the plurality of driver circuits.

14. The electroluminescent display of claim 1 wherein the electroluminescent cells are arranged in rows and columns and a single column of electroluminescent cells is driven by a plurality of driver circuits.

15. The electroluminescent display of claim 5, wherein connectors include conductive material that is insulated from said metal core layer.

* * * * *